(12) United States Patent
Olgaard et al.

(10) Patent No.: US 6,459,397 B1
(45) Date of Patent: Oct. 1, 2002

(54) SATURATION COMPENSATING ANALOG TO DIGITAL CONVERTER

(75) Inventors: Christian Volf Olgaard; Jane Xin-LeBlanc, both of Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/675,987

(22) Filed: Sep. 29, 2000

(51) Int. Cl.[7] ................................................. H03M 3/02
(52) U.S. Cl. ....................................................... 341/143
(58) Field of Search ................................. 341/139, 144, 341/155, 143, 158, 131

(56) References Cited

U.S. PATENT DOCUMENTS

| | | | | |
|---|---|---|---|---|
| 5,187,482 A | * | 2/1993 | Teimann | 341/139 |
| 5,608,399 A | * | 3/1997 | Coleman | 341/139 |
| 5,940,019 A | | 8/1999 | Maejima | |

* cited by examiner

*Primary Examiner*—Brian Young
(74) *Attorney, Agent, or Firm*—Mark A. Dalla Valle; Wildman Harrold Allen & Dixon

(57) ABSTRACT

The saturation compensating analog to digital converter has converter circuitry receiving an analog signal and outputting converted data. The converted data from the converter circuitry is processed and filtered to provide a digital data output. The digital data output is received into shift register circuitry before being transmitted for later-stage processing. When the converter circuitry is operating close to a saturated condition, a saturation detector generates a saturation signal. The saturation signal is received at a variable gain circuit which adjusts the gain of the input signal to the converter circuitry. The shift register circuitry also receives the saturation signal and provides an upshift of the digital data to compensate for the associated reduction in input gain provided by the variable gain circuit. In operation, the variable gain circuit is initially set to its maximum output, thus providing the maximum possible input signal to the converter. If a near-saturation conditional is detected, the variable gain circuit is stepped down, and the shift register circuitry provides an associated one bit step up. Such saturation compensation is continued to enable the converter circuitry to operate without saturating.

20 Claims, 3 Drawing Sheets

SATURATION COMPENSATING ANALOG TO DIGITAL CONVERTER

FIELD OF THE INVENTION

The field of the present invention is electronic devices in the form of analog to digital converters. More particularly, the described analog to digital converter is configured for operation in support of a wireless communication device.

BACKGROUND OF THE INVENTION

Wireless communication devices are widely used to communicate data, voice, and other information between physical locations without the use of wires. With the expanded use of wireless communication devices, a need has grown for faster and more reliable communication devices. At the same time, users are demanding that wireless communication devices be more compact and be easier to transport. For example, it is now common for a handheld mobile telephone handset to not only provide for voice communication, but these same handsets more frequently enable access to information by providing remote access to data networks such as the Internet.

Typically, a wireless communication device has a wireless receiver for receiving an analog signal transmitted from a transmitter. Often the analog signal is a radio frequency signal having voice or data modulated on to a carrier. The wireless receiver accepts and amplifies the analog signal, and may provide selected filtering. For example, band pass filters may be applied to the analog input signal to block the further processing of signals at adjacent frequencies.

Once the analog signal has been amplified and processed, the wireless communication device converts the analog signal into lower frequency digital data for further processing within the wireless communication device. The conversion of the analog signal to a digital representation generates a signal that is easier to process, for example, because it is operating at a lower frequency. This process is generally referred to as analog to digital conversion.

Although various technologies may be used to implement an analog to digital conversion, a commonly used analog to digital converter relies on a delta-sigma converter to convert an analog signal into a digital bit stream. The digital bit stream may then be further processed and filtered to provide a digital representation of the information carried in the analog input signal.

Analog to digital converters are designed to operate within an expected range of input level. While receiving input levels in the proper operating range, the digital output of the analog to digital converter provides a representation of the information carried by the analog signal. However, if the input level to the analog to digital converter exceeds the expected operating level, then the converter may be placed into a state of saturation. When saturated, the digital data output from the converter reflects the saturation condition, not the information carried in the analog signal. For example, once the converter is saturated, the digital data output from the converter may become all 1's, or may start oscillating and generate random data. Accordingly, any information from the input signal is lost. Since the converter is no longer providing accurate or useful digital information, any further processing of the digital data is futile. For example, if the analog signal carries informative information to a wireless handset, and the converter in the handset receiver saturates, the received informative signal will drop out, and the call may be lost.

In wireless receivers, the dynamic range at the input of the analog to digital converter is determined by the amount of filtering provided on the signal input to the converter as well as the fading characteristics of the received signal. For example, signals at adjacent frequencies may be sufficiently strong to drive the analog to digital converter into a state of saturation.

Accordingly, in known, conventional wireless devices, the input signal to the analog to digital converter is attenuated to a level that allows the analog to digital converter to operate at the maximum input levels expected to be received. Since such conditions only rarely occur, the wireless device is nearly always operating with an unnecessarily attenuated input signal. Such attenuation not only reduces the sensitivity of the receiver, limiting the device's useful operating range, but also increases the cost of manufacturing the wireless device as more sensitive components are required. However, even with such an attenuated input signal, it is likely that the wireless device will occasionally receive input signals exceeding the expected maximum level. In such a case, the analog to digital converter will saturate and any active information transfer will fail.

Therefore, there exists a need to accommodate unusually large input signals by avoiding saturating the analog to digital converter, while maintaining adequate sensitivity levels.

SUMMARY OF THE INVENTION

It is therefore an object of the present invention to provide a saturation compensating analog to digital converter. It is a further separate objective of the present invention to provide a saturation compensating analog to digital converter without modifying the base band portion of a wireless communication device. Therefore, to overcome the deficiencies of conventional systems, and to meet the stated objectives, a saturation compensating analog to digital converter is provided.

Briefly, the saturation compensating analog to digital converter has converter circuitry receiving an analog signal and outputting converted data. The converted data from the converter circuitry is processed and filtered to provide a digital data output. The digital data output is received into state machine before being transmitted for later-stage processing. When the converter circuitry is operating close to a saturated condition, a saturation detector generates a saturation signal. The saturation signal is received at a variable gain circuit which adjusts the gain of the input signal to the converter circuitry. The state machine also receives the saturation signal and provides an upshift of the digital data to compensate for the associated reduction in input gain provided by the variable gain circuit. In operation, the variable gain circuit is initially set to its maximum output, thus providing the maximum possible input signal to the converter. If a near-saturation conditional is detected, the variable gain circuit is stepped down, and the state machine provides an associated one bit step up. Such saturation compensation is continued to enable the converter circuitry to operate without saturating.

Advantageously, the saturation compensating analog to digital converter can be implemented without requiring any change to the base band receiver. For example, if the input signal to the converter is attenuated to avoid a saturation condition, the resulting output digital data is correspondingly upshifted to compensate for the reduced input gain. The detection and compensation for a saturation condition, is thereby accommodated in a manner that can be easily and efficiently integrated into existing wireless communication devices.

These and other features and advantages of the present invention will be appreciated from review of the following detailed description of the invention, along with the accompanying figures in which like reference numerals refer to like parts throughout.

DETAILED DESCRIPTION OF THE INVENTION

Figure 1:
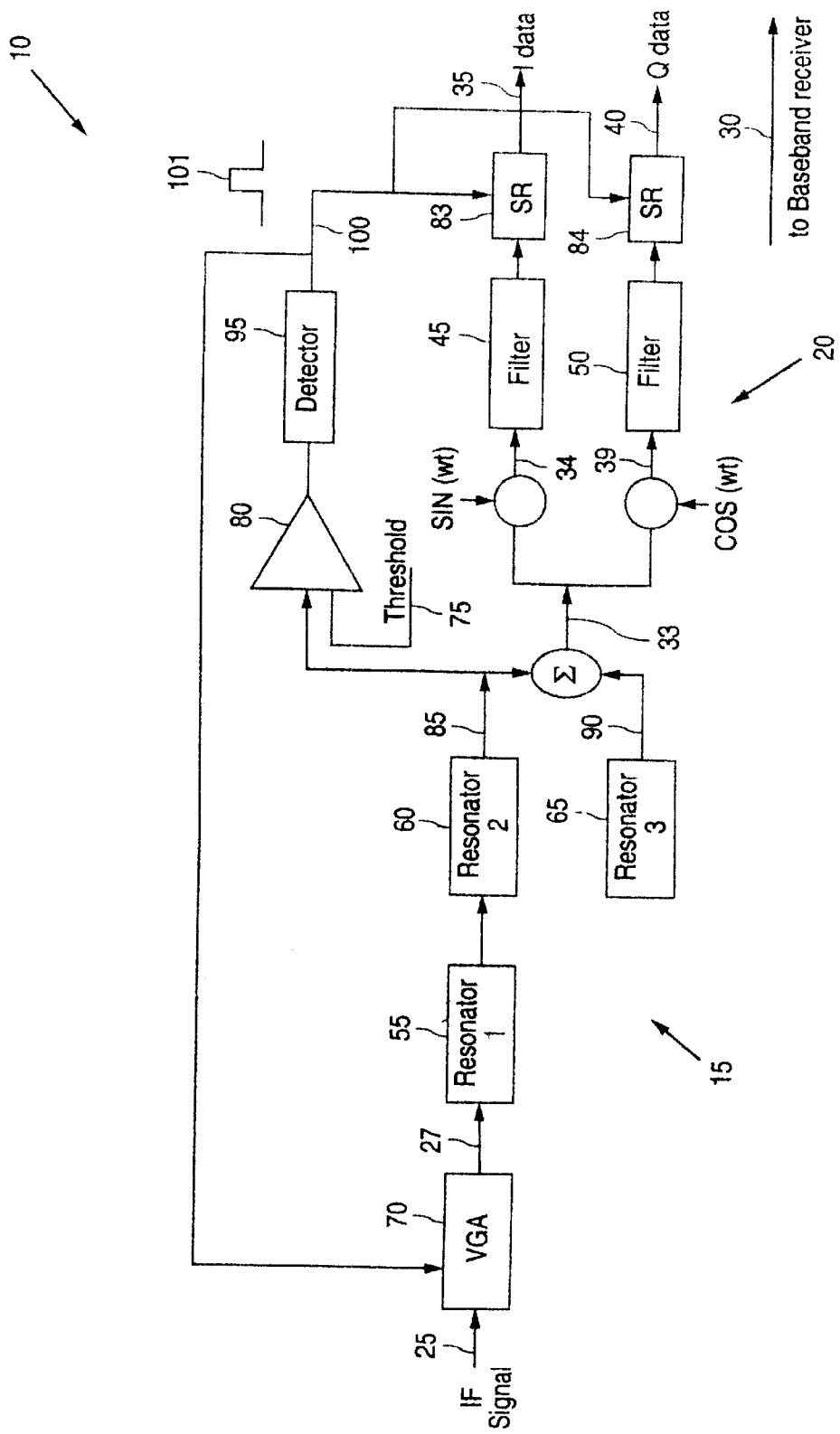
FIG. 1 is a block diagram generally showing a saturation compensating analog to digital converter made in accordance with one embodiment of the present invention.

In accordance with one embodiment of the present invention, a saturation compensating analog to digital converter (ADC) 10 is shown in FIG. 1. The ADC 10 is constructed to cooperate with other components (not shown) in a wireless communication device. Generally, the ADC 10 receives an analog input signal 25 and generates digital output data 30. In the wireless device for example, the input signal 25 may be an IF (intermediate frequency) signal from prior processing circuitry from a superheterodyne receiver. In a similar manner, the digital data output 30 may be sent to baseband receiver circuitry in the wireless communication device. Although the ADC 10 is described as being used with the IF signal in a superheterodyne receiver and its associated baseband circuitry, it will be appreciated that the disclosed invention may be used for other analog to digital conversion purposes. For example, analog to digital converters are used in other aspects of wireless communication, and in other fields such as data acquisition and audio.

The ADC 10 generally comprises converter circuitry arranged as a delta-sigma band pass converter 15 and a filtering section 20. The delta-sigma converter 15 has resonators 55 and 60 which provide oscillation frequencies for determining the band pass characteristics of the converter. In the described configuration, resonator 55 and resonator 60 are connected in serial and provide output signal 85. An output signal 90 from resonator 3 is summed with the first output signal 85 to generate a five-bit wide data 33. The data 33 is processed into I data 34 and Q data 39 in accordance with well known techniques. The I data 34 is received into I filter 45 and the Q data 39 is received into Q filter 50. The filters 45 and 50 process the I and Q data into multi bit digital data. The I and Q multi-bit data is passed through shift registers 83 and 84, respectively, before being communicated as a combined data signal 30 to the base band receiver (not shown). It will be appreciated that although ADC 10 uses a delta-sigma converter arrangement, other converter circuit technologies may be substituted for performing the analog to digital conversion. It will also be appreciated that ADC 10 may use a state machine for implementing the upshift function. The use of such a state machine may enable the use of more advanced decision login before generating an upshift or a downshift. For example, a state machine may be configured to receive a particular number of saturation signals in a set time period before upshifting the digital data.

In the ADC 10, the input signal 25 is received into a variable gain amplifier (VGA) 70. In the described example, the VGA amplifies an IF input signal 25 to generate an adjusted output analog output signal 27, which is received by resonator 55. The VGA 70 is constructed to provide controllable amplification in 6 db steps. Although the VGA 70 is constructed to operate in 6 db steps, it will be appreciated that other gain levels may be selected. Further, although the described example uses a VGA as a variable gain circuit to provide an adjusted signal, it will be understood that other components may be substituted to amplify or attenuate the signal level received by the converter circuitry.

The output signal 85 from resonator 60 is received at comparator 80. Comparator 80 also receives a threshold level 75. The threshold level 75 may be predetermined at a particular value, or may be adjustable by additional circuitry (not shown). When the output signal 85 from resonator 2 exceeds the threshold value 75, the saturation detector 95 generates a saturation signal 101 on saturation line 100. The saturation signal 101 is preferably in the form of a pulse. However, it will be appreciated that the saturation signal may be generated in other forms. It will also be appreciated that the detection of the saturation condition may be detected by monitoring other signals or outputs from the converter circuitry. The saturation signal is generated prior to the ADC being placed in a saturation condition. Accordingly, the saturation signal is an indicator that the ADC is close to saturation. By responding to the saturation signal, the ADC is enabled to avoid saturating, thereby assuring the generated data is not degraded due to saturation effects.

The saturation signal 101 is received at the VGA 70. In response to receiving the saturation signal 101, the VGA 70 attenuates the signal 27 to the first resonator 55 by one step. In a preferred embodiment, each step is arranged to be a 6 decibel decrease. For example, the VGA 70 may initially be set to provide 24 dB of gain. Upon receiving a triggering number of saturation signals, such as saturation signal 101, the VGA 70 will adjust the gain downward one 6 dB step to 18 dB. Thereafter, each time a triggering number of saturation signals 101 are received by VGA 70, the VGA adjusts its amplification downward by one 6 dB step. It will be appreciated that a state machine may be used to adjust the number and density of saturation signals that must be received before triggering the VGA and associated register shift.

The saturation signal 101 is also transmitted on saturation line 100 to I shift register 83 and Q shift register 84. Shift registers 83 and 84 are each configured to provide an upshift of one-bit each time a triggering number of saturation signals 101 are received. Accordingly, each time a triggering number of saturation signals 101 are received at a shift register 83, 84, the shift register will provide a one-bit upshift for the I data and Q data, respectively. By upshifting the multi bit data concurrent with the adjustment of the VGA 70, the value of the multi bit data is adjusted upwardly in inverse proportion to the attenuation of the input signal. Since the upshifting compensates for the attenuation of the input signal, the digital data output to the baseband receiver is always maintained within the expected range, and so exactly represents information in the input signal. Accordingly, the digital data output represents the informative signal, with no significant information loss due to distortion or saturation effects. Therefore, saturation compensation is accomplished in the ADC 10 without any adjustments or changes to any post processing circuitry, including the baseband circuitry.

In a preferred configuration of the ADC 10, the ADC 10 is constructed to convert the analog input signal 25 into 12 bit I and Q digital data output from filters 45 and 50. The 12-bit data is received into the shift registers 83 and 84, respectively, for bit upshifting to compensate for attenuation in the input signal from the VGA 70. The base band receiver may be constructed to receive, for example, 16-bit digital data. Accordingly, the shift registers 83 and 84 will output 16-bit data to be received by the base band receiver 30. In such a manner, the shift registers 83 and 84 are able to upshift the 12-bit data four bit positions without loss of information.

Since the shift register is constructed to allow for up to four upshifts, the ADC 10 also provides that the VGA 70 permits up to four corresponding cumulative attenuations of the incoming signal 25. In a preferred example of the ADC 10, the attenuation level and bit shifts are set according to the table below. As shown in Table 1, the 12 bit data from the I filter is 1010 0011 1011, which is shifted by the shift register according to the number of saturation signals received, and output as 16 bit data to the baseband receiver. For example, if the ADC 10 has generated two saturation signals, then the VGA 70 has been adjusted from 24 dB to 12 dB of amplification to enable the delta-sigma converter to operate without saturating. To compensate for the 12 dB reduction in input signal to the delta-sigma converter, the shift register is upshifted a total of 2 bits. In this example, the baseband receives 0010 1000 1110 1100.

TABLE 1

| NUMBER OF SATURATION SIGNALS RECEIVED | VGA AMPLIFICATION | TOTAL BIT SHIFTS | EXAMPLE I DATA SENT TO BASEBAND RECEIVER (1010 0011 1011 UNSHIFTED) |
| --- | --- | --- | --- |
| 0 | 24 db | 0 | 0000 1010 0011 1011 |
| 1 | 18 dB | 1 | 0001 0100 0111 0110 |
| 2 | 12 db | 2 | 0010 1000 1110 1100 |
| 3 | 6 db | 3 | 0101 0001 1101 1000 |
| 4 | 0 db | 4 | 1010 0011 1011 0000 |

Figure 2:
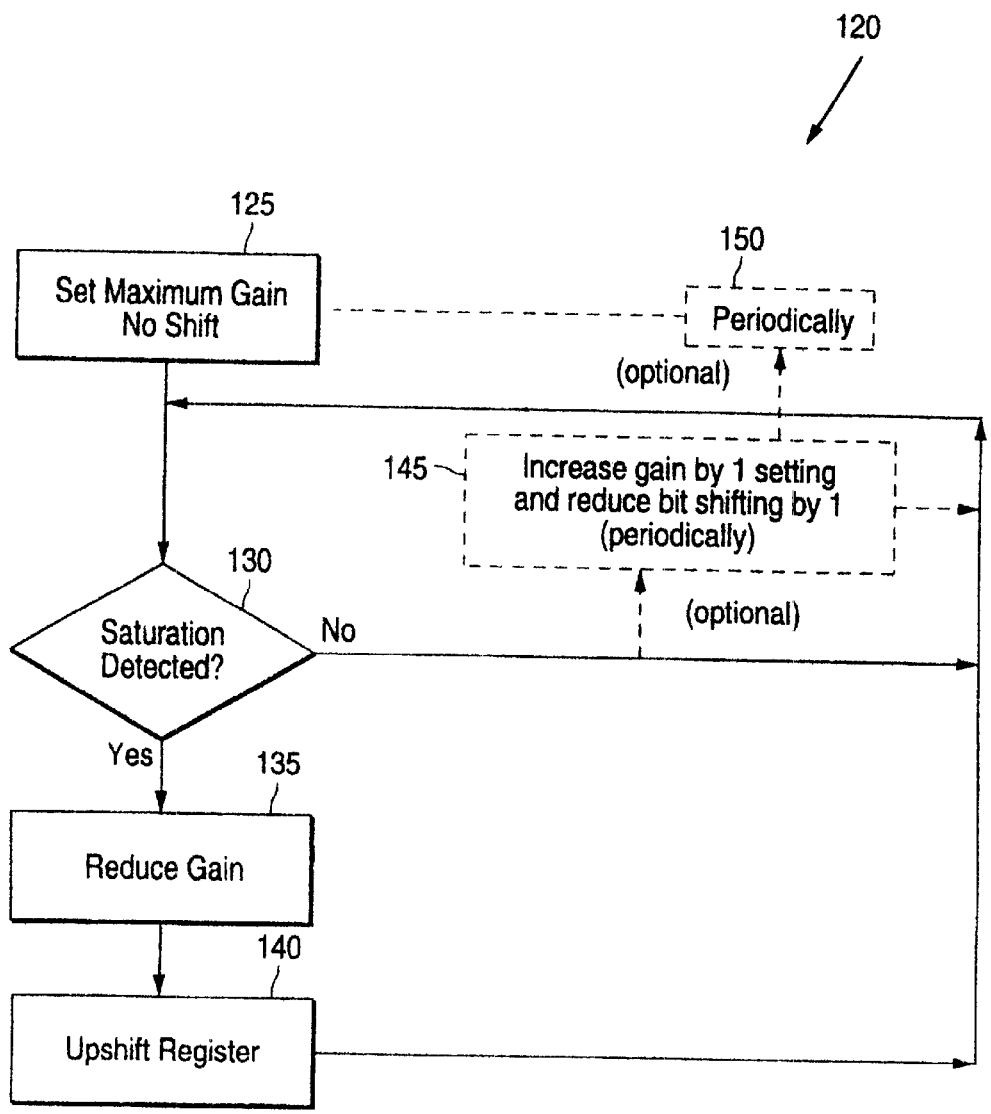
FIG. 2 is a flow chart of a method for detecting and compensating a saturation condition in an analog to digital converter in accordance with another embodiment of the present invention.

Referring now to FIG. 2, a method of compensating for saturation 120 is shown for ADC 10. The method 120 initially sets the VGA 70 for maximum gain and the shift registers 83 and 84 are set for no shift as shown in block 125. If a saturation condition is detected in block 130 by receiving a saturation signal 101, then the saturation signal causes the VGA to step down the input signal gain by one step as shown in block 135 and to cause a one-bit upshift in the shift registers 83 and 84 as shown in block 140. After the gain is reduced and the digital data upshifted, the system once again waits to determine if the ADC 10 is near or in a condition of saturation. If the ADC 10 is near or in a condition of saturation, then the gain is additionally reduced and an additional digital shift is performed as shown in blocks 135 and 140. Additional reductions and shifts are directed if further saturation signals are received. However, physical limitations in the ADC 10 may limit the number of times the method can compensate for a saturation condition. For example, the ADC 10 may be limited by noise introduced by the VGA 70. The ADC shown in FIG. 1 is limited to responding to four saturation signals. It will be appreciated that the number of allowed saturation signals can be adjusted, for example, by providing additional bits of resolution in the baseband receiver and the shift register.

In a preferred method, the gain is initially set to 24 db and is reduced by 6 db each time a saturation signal is received. It will be appreciated that other initial amplifications may be used and other step sizes utilized. In the preferred embodiment, the 6 db step was selected as a 6 db decrease in input signal corresponds to a one-bit upshift in the resulting digital data. The 6 db step also reduces power consumption and eases practical implementation.

In the method 120, the gain of the VGA 70 is reduced to a point where the ADC 10 can operate without saturating, and then continues operation at this reduced level unless another saturation condition is detected. In a particular implementation, for example, a TDD (Time Division Duplex) system, the system may be reinitialized each time the receiver starts receiving. Accordingly, the system will reset for each receiver time slot. For simplified implementation, method 120 does not provide a means to increase the gain of the VGA 70, unless the system is reinitialized to block 125.

It will be appreciated that method 120 can be optionally modified to periodically reinitialize to block 125 so the VGA 70 is operating at its highest gain without saturation, as shown by optional block 150. Alternatively, method 120 can be modified such that periodically the gain of the VGA 70 is upwardly adjusted one step, as shown by optional block 145. Thereafter, the method 120 could periodically increase the VGA gain by one step until a saturation signal was generated. By periodically increasing the VGA gain, the VGA is operated at its highest gain without causing saturation, even with changing input signal conditions. It will also be appreciated that the logic of method 120 may be implemented using a state machine. The use of a state machine may enable more advanced logic division to be used. For example, a state machine could introduce a hysteresis effect to avoid repeatedly toggling between shift states.

Figure 3:
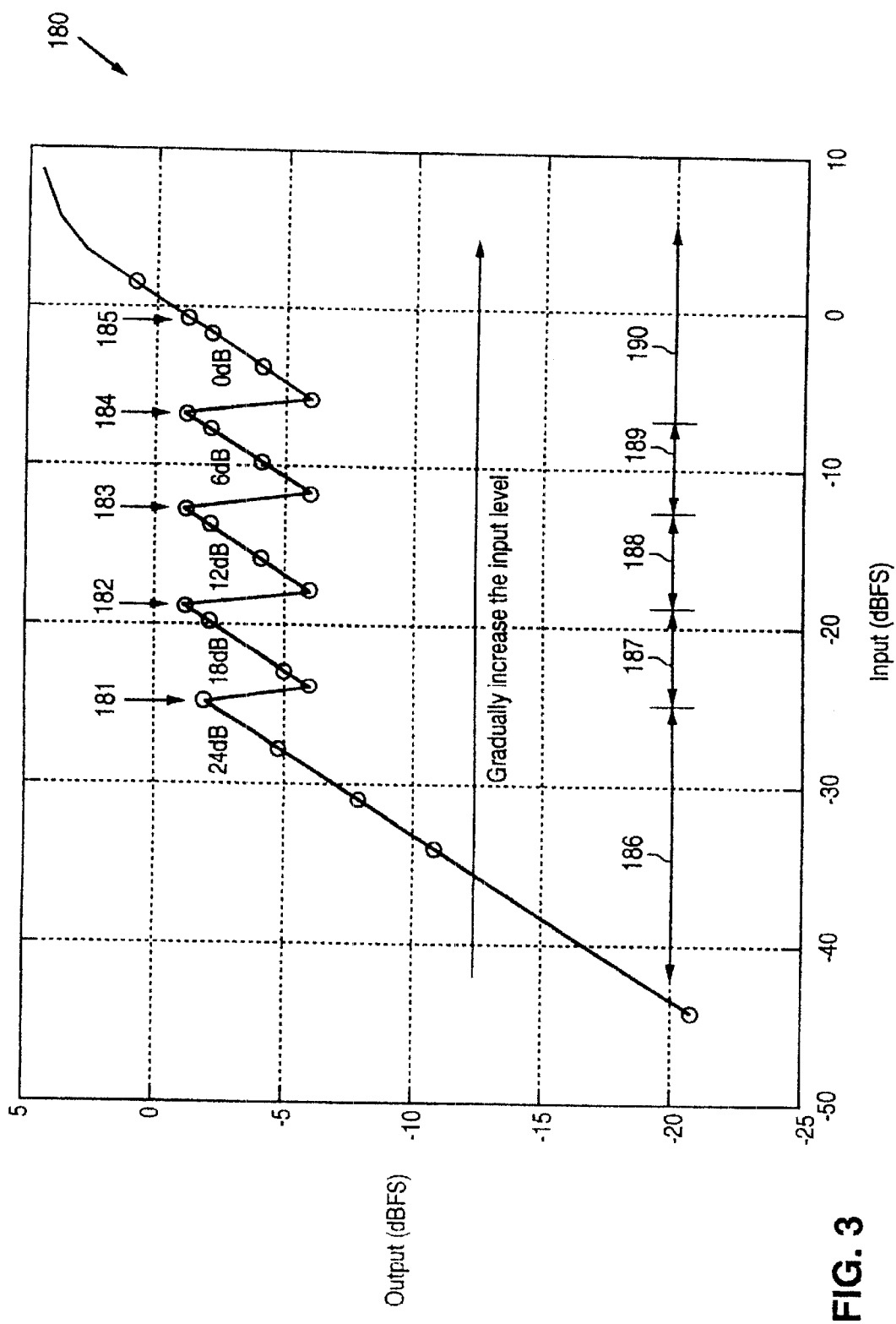
FIG. 3 is a chart showing measured performance of the variable gain amplifier in the embodiment of FIG. 1.

Referring now to FIG. 3, results are shown from ADC 10. More specifically, the X-axis of chart 180 is the input level of the IF signal 25 to VGA 70, and the Y-axis is the output level 27 from the VGA 70. As shown in chart 180, when the input 25 is in the range 186 from approximately −42 dB to −27 db, the gain of the VGA is set to 24 db, which is the maximum gain in the ADC 10. At point 181, the saturation detector generates a first saturation signal that is sent to the VGA 70, and the gain of the VGA 70 is adjusted one step downward to 18 db. Concurrently with adjusting the gain of the VGA 70 downward by 6 dB, the shift registers 83 and 84 provide a one-bit upshift to compensate the level of the digital data output 30. Since a delta-sigma converter is widely oversampled, the few bits that may be sampled and transmitted before the detection system settles will have little effect on the quality of the output data.

The ADC 10 then operates in range 187 until another saturation signal is detected at point 182. On receiving the second saturation signal, the VGA 70 reduces its gain one more step to 12 db and the shift register upshifts another bit to compensate for the additional 6 db reduction in input gain. The system then operates at 12 db in range 188 until a third saturation signal is received at point 183. On receiving the third saturation signal, the VGA similarly reduces its gain by 6 db to operate at 6 db in range 189. As the level of the input signal continues to increase on the X-axis, the ADC 10 once again goes into a condition of near saturation which is indicated at point 184. When the fourth saturation signal is received, the VGA 70 is directed to reduce its gain by one more step to operate at 0 db, which it then operates at for the remaining operational cycle. Of course, the input signal 25 can continue to be increased in range 190 until the ADC 10 is placed near another condition of saturation. Since ADC 10 is configured only to accommodate four adjustments to the input voltage, the ADC 10 would enter and continue to operate in a condition of saturation after point 185. Accordingly, since the ADC is operating in saturation the data in the input signal is lost and the data sent to the band pass receiver 30 would be providing erroneous information.

Although ADC 10 has been constructed to permit four adjustments to the input voltage gain and four corresponding upshifts to the digital data, other configurations may be used. For example, if the base band receiver is constructed to receive 18 bit data, then the ADC 10 could be constructed to accommodate six changes in input level and six corresponding bit upshifts.

One skilled in the art will appreciate that the present invention can be practiced by other than the preferred embodiments which are presented in this description for purposes of illustration and not of limitation, and the present invention is limited only by the claims which follow. It is noted that equivalents for the particular embodiments discussed in this description may practice the invention as well.

What is claimed is:

1. An apparatus including an analog to digital converter, comprising:
   a variable gain circuit receiving an input signal and a saturation signal and outputting an adjusted signal;
   converter circuitry connected to the variable gain circuit and receiving the adjusted signal, the converter circuitry generating digital data indicative of the adjusted signal;
   filtering circuitry connected to the converter circuitry and receiving the saturation signal and the digital data;
   a saturation detector operably connected to the converter circuitry and the filtering circuitry, the saturation detector generating the saturation signal when the converter circuitry has approached a saturation state; and
   wherein, responsive to receiving the saturation signal, the variable gain circuit attenuates the adjusted signal and the filtering circuitry causes an upshift of the digital data.

2. The apparatus according to claim 1, wherein the converter circuitry comprises a delta-sigma converter.

3. The apparatus according to claim 1, wherein the variable gain circuit comprises a variable gain amplifier.

4. The apparatus according to claim 1, wherein the variable gain circuit comprises a variable attenuator.

5. The apparatus according to claim 1, wherein the input signal comprises an IF signal.

6. The apparatus according to claim 1, wherein the converter circuitry includes a resonator, and the resonator is connected to the saturation detector.

7. The apparatus according to claim 1, wherein the saturation detector includes a comparator that compares a signal level from the converter circuitry to a threshold level.

8. The apparatus according to claim 1, wherein the saturation detector generates the saturation signal in the form of a pulse.

9. The apparatus according to claim 1, wherein the variable gain circuit, the converter circuitry, the filtering circuitry, and the saturation detector are implemented in a single integrated circuit chip.

10. The apparatus according to claim 1, wherein the filtering circuitry includes a shift register.

11. A method of operating an analog to digital converter, comprising the steps of:
    receiving an input signal;
    processing the input signal to generate an adjusted signal;
    converting the adjusted signal to digital data;
    generating a saturation signal when the analog to digital converter has approached saturation;
    attenuating the adjusted signal responsive to the saturation signal; and
    upshifting the digital data responsive to the saturation signal.

12. The method according to claim 11, wherein the attenuating step includes attenuating the adjusted signal in a 6 dB increment.

13. The method according to claim 12, wherein the upshifting step includes upshifting the digital data in a 1 bit shift.

14. The method according to claim 11, wherein the upshifting step includes upshifting the digital data in a 1 bit shift.

15. The method according to claim 11, wherein the generating step includes generating a plurality of sequential saturation signals.

16. The method according to claim 15, wherein the attenuating step is repeated each time one or more saturation signals occur in a given time frame.

17. The method according to claim 16, wherein the attenuating step includes attenuating the adjusted signal by 6 dB each time the attenuating step is repeated.

18. The method according to claim 15, wherein the upshifting step is repeated each time one or more saturation signals occur in a given time frame.

19. The method according to claim 11, wherein the upshifting step includes upshifting the digital data by 1 bit each time the attenuating step is repeated.

20. The method according to claim 11, further including the step of repeating the converting, generating, attenuating, and upshifting steps to maintain the digital data as being indicative of the attenuated adjusted signal.

* * * * *